United States Patent
Connolly et al.

(10) Patent No.: US 8,970,948 B2
(45) Date of Patent: Mar. 3, 2015

(54) METHOD AND SYSTEM FOR OPERATING SEMICONDUCTOR OPTICAL AMPLIFIERS

(71) Applicants: John C. Connolly, Clarksburg, NJ (US); Donald E Ackley, Cardiff, CA (US); Scott L Rudder, Hopewell, NJ (US); Harald R. Guenther, Schnecksville, PA (US)

(72) Inventors: John C. Connolly, Clarksburg, NJ (US); Donald E Ackley, Cardiff, CA (US); Scott L Rudder, Hopewell, NJ (US); Harald R. Guenther, Schnecksville, PA (US)

(73) Assignee: Innovative Photonic Solutions, Inc., Monmouth Junction, NJ (US)

( * ) Notice: Subject to any disclaimer, the term of this patent is extended or adjusted under 35 U.S.C. 154(b) by 0 days.

(21) Appl. No.: 14/024,607

(22) Filed: Sep. 11, 2013

(65) Prior Publication Data

US 2014/0072002 A1 Mar. 13, 2014

Related U.S. Application Data

(60) Provisional application No. 61/700,237, filed on Sep. 12, 2012.

(51) Int. Cl.
*H01S 5/062* (2006.01)
(52) U.S. Cl.
USPC ............................................. 359/344; 372/22
(58) Field of Classification Search
USPC .................... 359/344, 328; 372/22
See application file for complete search history.

(56) References Cited

U.S. PATENT DOCUMENTS

| 5,119,039 A | 6/1992 | Olshansky et al. |
| 5,175,643 A * | 12/1992 | Andrews ................. 359/339 |
| 5,745,284 A * | 4/1998 | Goldberg et al. .......... 359/344 |

FOREIGN PATENT DOCUMENTS

WO   WO 2011/051446   6/2011

OTHER PUBLICATIONS

G.Grosskopt, "Characteristics of Semiconductor Laser as Phase Modulator", Electronic Letters, vol. 25, 1188-1189 (1989).
J.Mork, "The Modulation Response of a Semiconductor Laser Amplifier," IEEE Journal of Selected Topics Quantum Elect., vol. 5, 851, May/Jun. 1999.
E. Udvary, "Linearity and Chirp Investigations on Semiconductor Optical Amplifier as an External Optical Modulator," Hiradas Technika 42, 46 (2007).
W. Choi, "Low Insertion Loss and Low Dispersion Penalty InGaAsP Quantum-Well High Speed . . . " Journal of Lightwave Technology, vol. 20 issue 12 (2002).
S.Saini, Thermal Considerations of High Power Semiconductor Lasers . . . : Proceedings of SPIE, vol. 6478, Feb. 2007.
K.Wakita, Semiconductor Optical Modulators, p. 12, Springer, 1998.

(Continued)

*Primary Examiner* — Mark Hellner
(74) *Attorney, Agent, or Firm* — Law Office of Carl Giordano, PC (57) ABSTRACT

Disclosed are systems and methods for using a semiconductor optical amplifier (SOA) as an optical modulator for pulsed signals. In accordance with the principles of the invention, the SOA can be biased with a negative voltage to suppress transmission and improve modulator extinction and biased with a positive pulsed signal with sufficient amplitude to forward bias the amplifier (SOA), both transmitting the carrier and increasing its amplitude by means of a gain provided by the SOA under forward biased conditions. In addition, the forward bias voltage may be selected to compensate for losses within the SOA.

37 Claims, 9 Drawing Sheets

(56) References Cited

OTHER PUBLICATIONS

S-L Chuang, "Exciton Green's Fucntion Approach to Optical Absorption in a Quantum Well . . . " Phys. Rev. B, 42, 2, pp. 1500-1509 (1991).

D.A.B.Miller, "Electric-Field Dependence of Linear Optical Properties in Quantum Well Structures . . . " IEEE Journal of Quantum Elec., vol. QE-22 (Sep. 1986).

J.Mellis, "Direct Optical Phase Modulation in Semiconductor Laser Amplifier," Electronics Letter, vol. 25, No. 10 (1989).

* cited by examiner

METHOD AND SYSTEM FOR OPERATING SEMICONDUCTOR OPTICAL AMPLIFIERS

CLAIM OF PRIORITY

This application claims, pursuant to 35 USC 119, priority to and the benefit of the earlier filing date to that U.S. Provisional Application Ser. No. 61/700,237, entitled, "Method for Operating Semiconductor Optical Amplifiers as Modulators," filed Sep. 12, 2012. The entire content of the above-referred-to application is incorporated, herein, by reference in its entirety.

FIELD OF THE INVENTION

This invention relates to semiconductor optical amplifiers and, more particularly, to semiconductor optical amplifiers which are negatively biased and driven by positive voltage pulses.

BACKGROUND

Semiconductor Optical Amplifiers (SOAs) have been shown to operate as modulators in applications for fiber optical communications. However there has been minimal work done in the area of applying SOAs to operate as modulators for other applications and much of that previous work has been related to phase modulation. For example, Mørk et al. (The Modulation Response of a Semiconductor Laser Amplifier," Jesper Mørk, et al., IEEE Journal of Selected Topics in Quantum Electronics, Vol. 5, May/June 851, 1999) analyzed the performance of SOAs as amplitude modulators for small-signal analog modulation frequencies greater than 10 GHz.

For other applications, such as coherent imaging, however, high extinction ratio and narrow linewidth are critical and involve operating the SOA under large signal conditions while still minimizing the "chirp" added to the linewidth by the amplifier. Extinction ratios greater than 20 dB are required for good system performance.

Comparable modulator components such as acousto-optic modulators (AOMs), electro-absorption modulators (EAMs), and electro-optic phase modulators used in an interferometer configuration (e.g., such as a Mach-Zehnder interferometer) have been used as amplitude modulators. Acousto-optic modulators use high frequency acoustic signals to modulate the refractive index of an acoustically active material such as lithium niobate, to create a diffraction grating that can scatter the light signal and, hence, modulate its amplitude. The disadvantage of AOMs is that they require high power and high frequency acoustic signals to allow high speed modulation. These factors increase the cost and complexity of the drive electronics. Additionally, AOMs can be bulky and hard to utilize in miniaturized systems.

Electroabsorption modulators are semiconductor heterostructure devices that operate by voltage shifting of the semiconductor optical bandgap using the Franz-Keldysh effect or quantum confined Stark effect. EAMs designed in a waveguide configuration can have very high modulation bandwidths, of the order of tens of GHz. However, because of the need to couple light in and out of the edges of the waveguide, they can have high coupling losses. For example, when fiber coupled, the fiber-to-fiber insertion losses can exceed 5 dB for wavelengths of 1550 nm, and sometimes approach 15 db, especially for visible wavelengths where the fiber optic spot size and the semiconductor waveguide are much smaller. See, for example, "Low Insertion Loss and Low Dispersion Penalty InGaAsP Quantum-Well High-Speed Electroabsorption Modulator for 40-Gb/s Very-Short-Reach, Long-Reach, and Long-Haul Applications," Won-Jin Choi, et al., Journal of Lightwave Technology, Vol. 20, Issue 12, p. 2052, 2002.

Thus, high power seed lasers or subsequent amplification are required to make up for the lost optical signal. In addition, the extinction coefficient of EAMs is typically not very high, reaching approximately 11 dB for waveguide devices with high RF bandwidths (Id.). Mach Zehnder or other interferometer style amplitude modulators suffer from the same issues, plus the chip designs are typically more complex; requiring multiple waveguides and branching and combining junctions.

Thus there is a need for an absorption modulator design that can provide high extinction ratios and good coherence properties while minimizing insertion loss.

SUMMARY OF THE INVENTION

Disclosed is a method for using a semiconductor optical amplifier as an optical modulator for pulsed signals. In accordance with the principles of the invention, the SOA can be biased with a negative voltage to suppress transmission in the absence of a pulse and improve the modulator extinction. A positive pulsed signal is applied with sufficient amplitude to forward bias the amplifier, both transmitting the carrier and increasing its amplitude by means of the gain provided by the SOA under forward biased conditions.

BRIEF DESCRIPTION OF THE DRAWINGS

For a better understanding of exemplary embodiments and to show how the same may be carried into effect, reference is made to the accompanying drawings, it is stressed that the particulars shown are by way of example only and for purposes of illustrative discussion of the preferred embodiments of the present disclosure, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

It is to be understood that the figures and descriptions of the present invention described herein have been simplified to illustrate the elements that are relevant for a clear understanding of the present invention, while eliminating, for purposes of clarity only, many other elements. However, because these eliminated elements are well-known in the art, and because they do not facilitate a better understanding of the present invention, a discussion of such elements of the depiction of such elements is not provided herein. The disclosure herein is directed also to variations and modifications known to those skilled in the art.

DETAILED DESCRIPTION

Before the present devices, systems and methods are described, it is to be understood that this invention is not limited to the particular processes, devices, or methodologies described, as these may vary. It is also to be understood that the terminology used in the description is for the purpose of describing the particular versions or embodiments only and is not intended to limit the scope of the present disclosure which will be limited only by the appended claims.

Certain terms are defined in this section to facilitate understanding of exemplary embodiments.

A semiconductor optical amplifier (SOA) provides optical gain, typically embodied in a layered semiconductor structure that incorporates a waveguide that transmits light from the entrance facet of the device to the exit facet. The semiconductor optical amplifier is typically excited by injection of electrons and holes through electrical contacts. The facets of the semiconductor optical amplifier are often provided with an anti-reflection coating to reduce feedback into the device that could give rise to unwanted stimulated emission. In other embodiments, the waveguide is configured to be at an angle to the normal to the facet in order to direct reflections that might otherwise give feedback out of the waveguide. In some embodiments, the waveguide may be curved. In some embodiments, more than one of the above techniques may be employed to reduce feedback. Detailed operation of SOAs is well-known in the art and need not be discussed in further detail herein.

A superluminescent light-emitting diode (SLD) is a broadband semiconductor light source that is often the same type of structure used as a semiconductor optical amplifier, as described above. An SLD can provide a relatively broad Gaussian-like spectrum of optical emission and can provide several tens of milliwatts of optical power when driven with sufficient current. Detailed operation of SLDs is well-known in the art and need not be discussed in further detail herein.

A bias-T (or bias tee) is a three port electrical network used for setting the DC bias point of electronic components without affecting other components in a radio frequency (RF) system. A low frequency port is used to set the bias. A high frequency port passes RF pulses but blocks the biasing voltages. A combined port is connected to the device.

The system described in this disclosure utilizes a semiconductor optical amplifier to provide both modulation and gain. Electro-absorption modulators (EAMs) are typically quantum-well devices that use the quantum-confined Stark effect to shift the band gap of a direct gap semiconductor efficiently and, hence, modulate the optical absorption of the device. For high speed and efficient extinction, EAMs are typically designed in a waveguide configuration wherein the electric field is applied using contacts on the surface of the device, perpendicular to the direction of propagation of the light. This necessitates edge coupling of the light, both into and out of the modulator chip. As the propagating mode in the waveguide can be quite small and often has an elliptical cross-section (typically 1 μm high by 3 to 10 μm wide), the optical coupling is poor and the devices can have a high insertion loss. Coupling to devices operating in the visible region of the optical spectrum is particularly lossy because the optical mode size is especially small due to the shorter wavelength.

In order to compensate for the high insertion loss of EAMs, it is desirable to provide a method of operation that can provide additional optical gain for the light propagating through the modulator device. Semiconductor optical amplifier amplifiers (SOAs) are semiconductor devices quite similar in design to EAMs, but are typically operated under forward bias conditions with drive currents in the range of 10-200 mA (milliamperes). Single pass optical gains can be as high as 18-20 dB for SOAs that incorporate single mode optical fiber coupling. However, SOA devices operated at higher drive currents can broaden the linewidth of single frequency seed lasers through a combination of carrier induced frequency "chirp" and thermal effects. The seed laser may be a semiconductor diode layer or a hybrid external-cavity laser. A description of a hybrid external cavity laser may be found in co-pending U.S. application Ser. No. 13/957, 586, "Wavelength-Stabilized Diode Laser," filed Aug. 2, 2013, the contents of which are incorporated by reference herein. Additionally, the SOA devices can have transmission even when there is no forward bias depending on the location of the band gap relative to the wavelength of a seed laser. Thus, an SOA device can have a poor extinction ratio if used as a modulator; offsetting the advantage of optical gain.

In accordance with the principles of the invention, an SOA operating with a combination of bias voltages, such that the device is efficiently turned off in the absence of a signal (e.g., a pulse) but provides optical gain when the signal (e.g., the pulse) is present, is disclosed. This biasing method is shown in the exemplary embodiment of FIG. 1.

Figure 1:
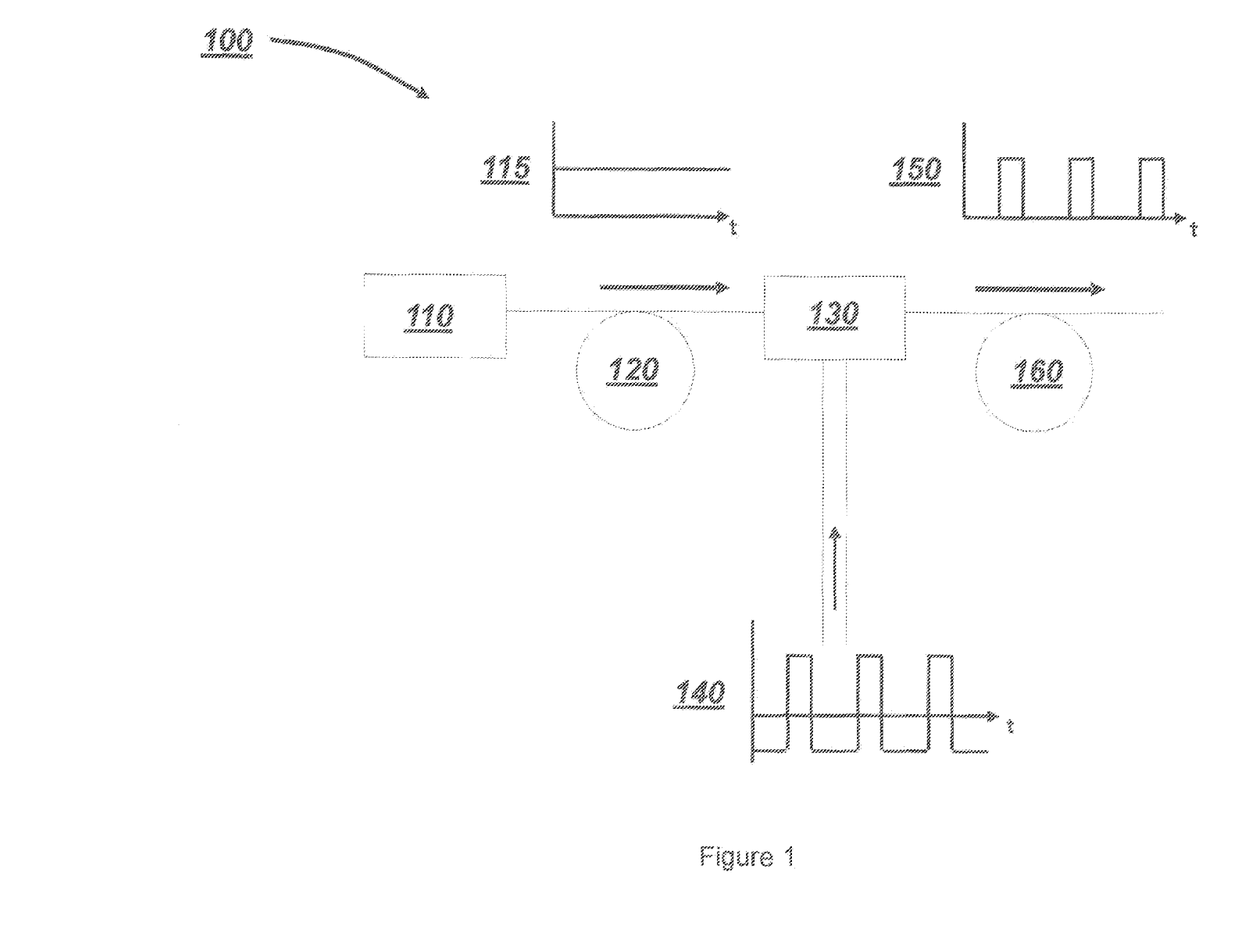
FIG. 1 illustrates a schematic of an exemplary embodiment of the invention.

FIG. 1 illustrates a block diagram of an optical modulation circuit, 100, wherein a narrow linewidth seed laser, 110, typically an external cavity laser (ECL) diode or a distributed feedback (DFB) laser diode, is coupled to the SOA, 130 operating as a modulator through an optical fiber 120. The connections to the optical fiber, 120, may be effected by use of low-loss fiber optic connector or by fusion splicing the fibers. The SOA device, 130, is typically packaged in a 14-pin butterfly package common to the industry, but may be contained in alternative packages as well, as long as provision is made for input and output optical fibers. The SOA package, 130, has internal coupling optics to couple the optical signal from seed laser, 110, into and out of the semiconductor optical amplifier (SOA) chip, 130, efficiently.

Figure 2:
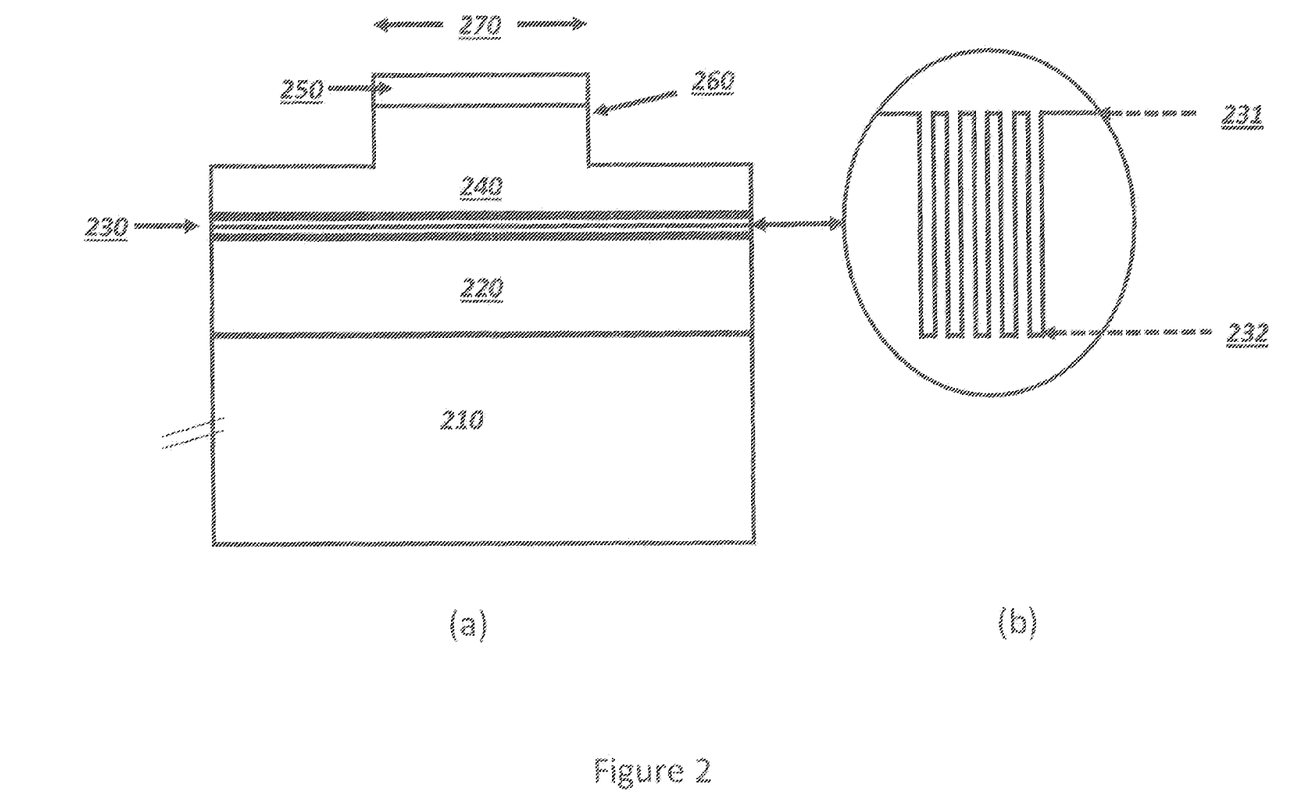
FIG. 2 (represented as 2(a) and 2(b)) illustrates a cross-section of a typical semiconductor amplifier structure.

An exemplary semiconductor amplifier structure is shown in FIG. 2($a$) with layers of appropriate semiconductor materials grown epitaxially on a substrate, 210. An exemplary substrate material for amplification at wavelengths in the 780 nm to 890 nm range is n-GaAs. An n-cladding layer, 220, may be epitaxially grown on top of the substrate material. For this same wavelength range, an exemplary n-cladding material is n-AlGaAs. An active layer, 230, is grown on top of the n-cladding layer, 220. This active layer may have a quantum-well structure. As shown in the inset of FIG. 2($b$), the active layer may comprise a quantum-well structure with multiple wells, 232, that may be comprised of GaAs, surrounded by barrier layers, 231, that may be comprised of AlGaAs. A p-cladding layer, 240, is grown on top of the active layer, 230, p-AlGaAs.

A cap layer, which may be comprised of p+ GaAs, is next grown on top of the p-cladding layer, 240. As is known in the art, many other materials may be used. Also shown in FIG. 2(a) is a ridge waveguide structure, 260, which is typically formed by etching to have a width, 270. The ridge waveguide structure 220 confines the optical mode in the directions perpendicular to and parallel to the active layer, 230, respectively. The width, 270, of such an exemplary ridge waveguide is approximately 3 μm for operation in the exemplary wavelength regime. Fabrication and operation of SOA devices are well-known in the art and further details regarding the method shown in FIG. 2(a), (b) is not presented herein.

Figure 3:
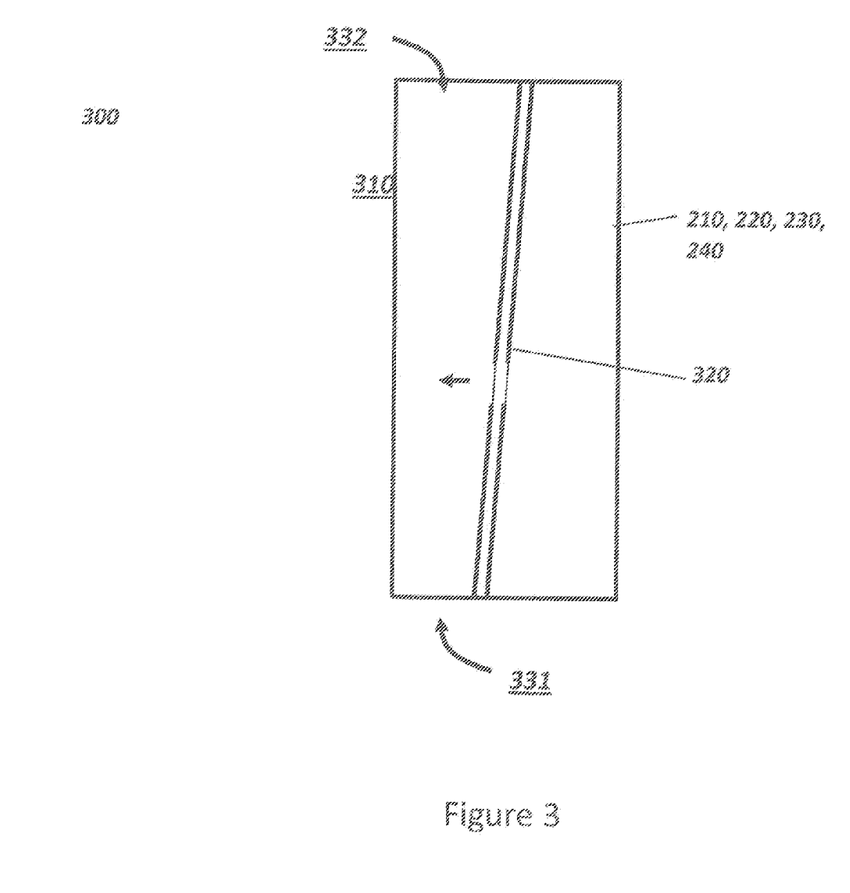
FIG. 3 illustrates a top view of a typical semiconductor amplifier device.

FIG. 3 illustrates a top view of an exemplary semiconductor amplifier structure 300. In this illustrated example, the main body of the SOA device, 310, comprises layers 210, 220, 230, and unetched portion of 240 positioned on top of each other (as shown in FIG. 2(a)). The ridge waveguide structure, 320, (i.e., shown as having width 220, in FIG. 2(a)) may be formed at an angle to the entry facet, 331, and exit facet, 332, of the semiconductor amplifier chip 300, in order to reduce reflections from those facets. The facets, 331 and 332, may have anti-reflection coatings (not shown) deposited on them to further reduce reflections. The length of the semiconductor amplifier chip is typically of the order of 1 mm.

Referring again to FIG. 1, a pulsed electrical input signal, 140, is provided to the SOA device, 130, and a predominantly single continuous wavelength (CW) optical signal, 115, (represented by an intensity v. time plot, showing a substantially constant intensity over time) provided by seed laser, 110, is modulated by the pulsed electrical signal to provide a pulsed output optical signal, 150, on output fiber, 160. The electrical input signal, 140, is composed of pulses of known duration and duty cycle. Output optical signal 150 has pulse duration and duty cycle substantially similar to that of electrical input signal 140.

Figure 4:
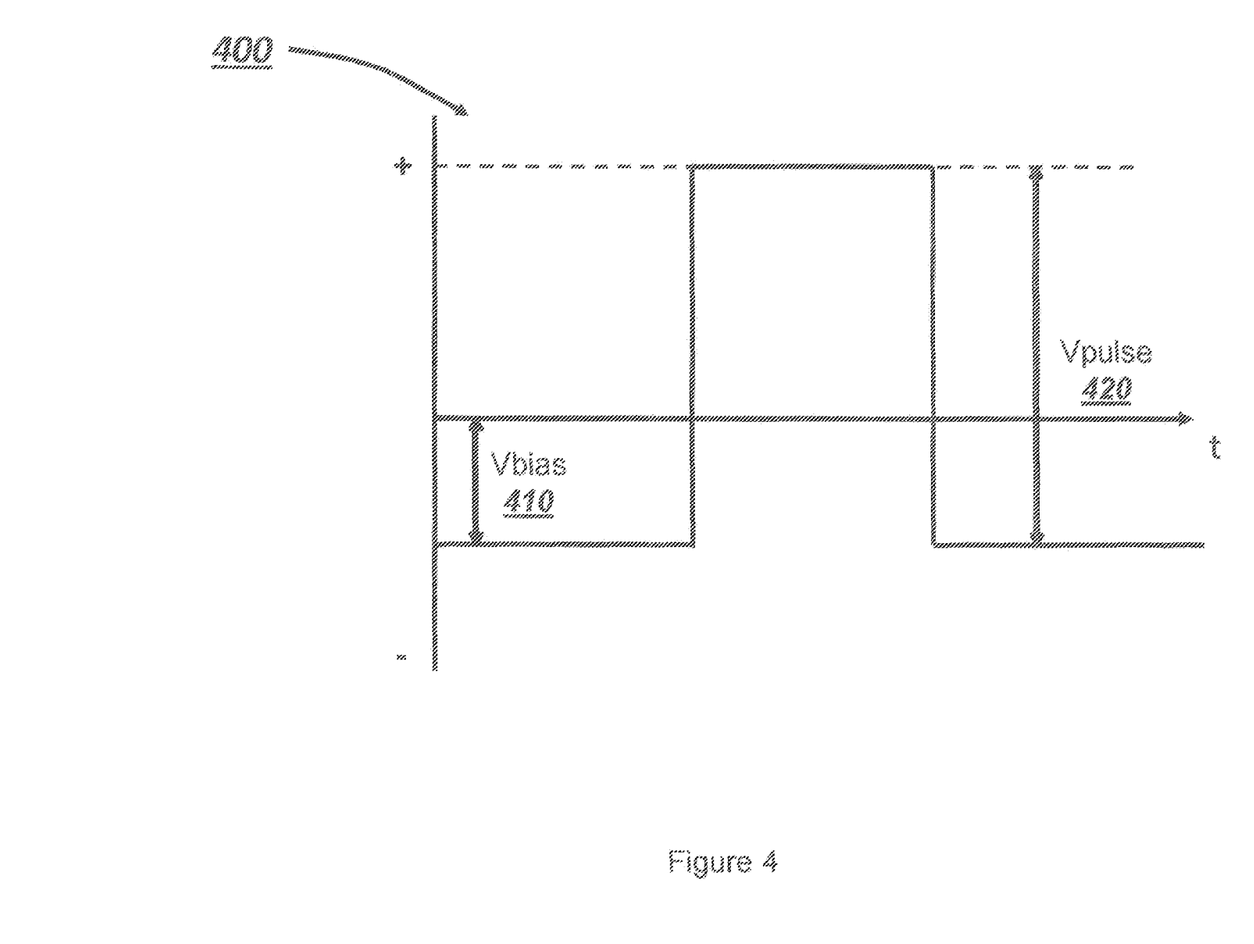
FIG. 4 illustrates a detailed view of the electrical actuating signal to the semiconductor optical amplifier, in accordance with the principles of the invention.

To achieve low off-state transmission in accordance with the principles of the invention, the SOA device, 130, is reverse biased with a DC potential in the range of about 0 to about 10V. This reverse potential or voltage serves to shift the optical band gap of the SOA device, 130, to lower energies (and hence, longer wavelengths) increasing the absorption of the CW optical signal 115 provided by seed laser, 130. Typically the lasing wavelength 115 of seed laser, 130, is chosen to be near but below the bandgap energy of the SOA device, 130. For example, a seed laser, 130, providing a few mW (milliwatts) of coupled power into the SOA device, 130, can be extinguished efficiently with reverse bias voltages in the range of 2-3V. The transmitted power through the coupled SOA device, 130, can be reduced to the level of a few μW (microwatts) with the application of a reverse bias signal, $V_{bias}$, 410 (as depicted in FIG. 4). This level of reverse bias is sufficient to provide extinction ratios of the order of 30 dB under conventional modulating conditions. In one aspect of the invention, the reverse voltage bias applied to the SOA device 130 is matched with, or related to, the power of the seed laser, 110. As shown in FIGS. 1 and 4, the electrical pulses of electrical signal 140 includes a first voltage 410 sufficient to reverse bias the SOA, 130, and a second voltage 420 sufficient to forward bias the SOA, 130.

Higher seed laser power requires additional (greater) reverse bias to the SOA, 130, to fully extinguish the optical signal provided by the seed laser, 110. The aforementioned reverse bias, $V_{bias}$, 410, and a pulsed modulating signal, $V_{pulse}$, 420, used to modulate the optical signal are shown as one cycle of a pulse train, 400, in FIG. 4. The pulsed forward voltage, Vpulse, 420, provided to the SOA, 130, is sufficient to offset the dc reverse bias, $V_{bias}$, 410, and cause forward current to flow in SOA device 130.

The two potentials (i.e., voltages 410, 420) may be summed in a bias-T, which is commonly known in the art for combining DC and RF (or pulsed) signals, or can be readily combined using electronics provided, for example, in a transceiver driver chip. Typically, a pulsed voltage of 2-5 V is sufficient to offset the DC reverse bias and cause forward current to flow in the SOA device, 130.

For high-speed operation, a resistor is often provided in series with the SOA 130 to provide RF matching into instrumentation utilizing 50-ohm source impedances and loads. As the SOA, 130, has a non-linear current-voltage characteristic typical of a diode, the incorporation of a 50-ohm source impedance has the advantage of linearizing the load to the drive electronics and improving the characteristics of the drive current pulse.

Alternatively, the SOA device, 130, can be placed proximate to the drive electronics to minimize the effect of electrical reflections caused by a mismatched load. The use of a matching circuit (not shown) including passive components, such as inductors, transformers, and capacitors, in addition to the resistor may be advantageous to compensate for the non-linear load characteristics of the SOA device, 130, especially when forward biased. Additionally, active matching using integrated circuits may be advantageous for improving the characteristics of the drive pulse 140. For example, an emitter follower configuration may be used to transform the low impedance of the SOA device 130 to a higher impedance that can match a transmission line.

To maintain the linewidth of the seed laser, 110, which is especially important for applications such as coherent communications, LIDAR, or coherent wind shear detection. It is useful to limit the drive current to the SOA device, 130. Degradation of the linewidth of the seed laser 110 is predominantly caused by two factor's. The first factor is carrier induced frequency chirp, wherein the injected carriers alter the refractive index of the semiconductor laser in a dispersive manner such that the linewidth is broadened. Carrier induced frequency chirp dispersion tends to occur on a sub-nanosecond time scale and, thus, affects the linewidth of the seed laser 110 during the pulse rise and fall times, or when sub-nanosecond pulses are used. The second factor is temperature induced broadening, whereby dispersion is induced into the optical pulse by localized temperature variations of the refractive index of the semiconductor that occur during the optical pulse. Temperature induced broadening typically occurs on longer time scales, typically hundreds of nanoseconds to microseconds. See, for example, Simarjeet Singh Saini, et al., "Thermal considerations in High Power Semiconductor Lasers and Semiconductor Optical Amplifiers, in Photonics Packaging, Integration, and Interconnects" VII (Proceedings Volume), Proceedings of SPIE Volume: 6478, Editor(s): Allen M. Earman; Ray T. Chen, 6 Feb. 2007.

It is a particular advantage of the method disclosed here that linewidth dispersion is minimized for operation with optical pulses in the range of about 20 to about 200 ns (nanoseconds).

In order to further minimize dispersion effects, it is also advantageous to operate the SOA device, 130, at low currents so as to minimize large variations in carrier density and large temperature swings in the device. Optimally, the SOA device, 130, is operated at forward currents less than 100 mA. In one aspect of an embodiment of the invention, the SOA device, 130 is operated at forward currents of loss than 60 mA. In this operating mode, the coherence length of the modulated optical signal may be maintained above 5 meters. Additionally, the SOA device 130 can provide gain in excess of 6 dB for the modulated optical signal at the low operating currents while maintaining an extinction ratio in excess of 30 dB. In the absence of forward current, the gain of the devices is minus 10 (−10) dB, which can be otherwise described as an insertion loss of 10 dB. This demonstrates a clear advantage of operating the SOA device, 130, in a hybrid modulation mode in that the considerable insertion loss incurred by fiber coupling into and out of the SOA device 130 chip can be readily compensated while retaining good extinction ratios and coherence properties. In particular, the wavelength of the seed laser 110 may be chosen to maximize extinction loss independently of the insertion loss as the insertion loss is compensated by the gain of the SOA device 130 when operated with a forward bias current pulse.

A particular advantage of operating the SOA device, 130, as a modulator with the drive scheme disclosed herein is a substantial increase in extinction ratio. Operated solely with reverse bias, high speed EAMs typically operate with extinction ratios of approximately 11 dB at RF frequencies. However, the additional gain provided by the SOA device, 130, operating with pulsed modulating current as shown herein can be large; leading to extinction ratios in excess of 30 dB for drive currents of only 40 mA. The extinction ratios can be further enhanced by choosing the wavelength of the seed laser 110 to maximize extinction, independently of any insertion loss considerations.

Yet another advantage of operating the SOA device, 130, as a modulator is that for particular time scales loss of coherence due to carrier induced chirp or thermal variations in the refractive index can be virtually eliminated. As carrier induced dispersion occurs on a sub-nanosecond time scale, and thermal effects occur on a time scale of microseconds, for pulse widths of the order of 20 ns to 2 μs, dispersion effects can be limited. This reduction in dispersion effects is further improved through the use of relatively low drive currents to achieve sufficient forward gain to offset the fiber coupling losses to the SOA device, 130.

In yet another advantage of operating the SOA, 130, as a modulator including forward biasing of the SOA device, 130, to provide gain, the wavelength 115 (as represented by the substantially constant intensity v. time shown in FIG. 1) of the seed laser 110 can alternatively be placed at a spectral peak of the optical gain to minimise carrier dispersion effects and maximize optical gain.

Alternatively, the combination of seed laser 110, optics, and SOA 130 can be realized using miniature free space optics to achieve a small form factor for the component combination.

Figure 5:
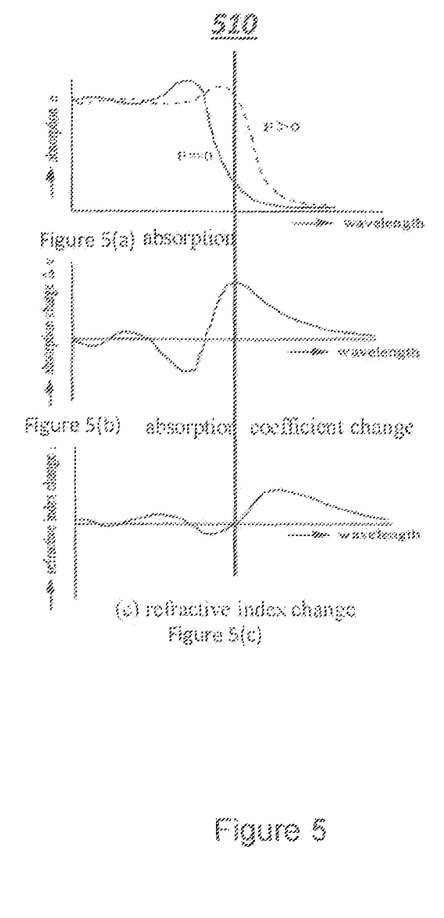
FIG. 5 (represented as 5(a), 5(b), 5(c)) illustrates the spectral dependence of absorption, differential absorption, and refractive index change for an EAM.

In another aspect of the invention, the wavelength 115 of the seed laser, 110, may be advantageously chosen to be at a wavelength longer than the wavelength of the first absorption peak of the SOA device, 130, such that at the desired applied electric field the differential absorption is maximized as shown in FIG. 5. FIG. 5, which has been adapted from *Semiconductor Optical Modulators*, Koichi Wakita, p. 12, Springer (1998) illustrates in the upper graph, (FIG. 5(*a*)) the absorption coefficient, α, of an electro-absorption modulator, in the middle graph (FIG. 5(*b*)), an absorption coefficient change and in the lower graph (FIG. 5(*c*), a refractive index change. As shown by the vertical line, 510, an operating wavelength may be chosen that maximizes the absorption change when the absorption peak is shifted by the applied electric field, F. In addition, by choosing the seed laser wavelength to be at a maximum of the differential absorption, the corresponding differential change in refractive index, $\Delta\eta$, is reduced to zero as shown in FIG. 5(*c*). As is well known in the art, the wavelength dependence of the real part of the refractive index and the absorption (imaginary part) of the complex refractive index of an optical material may be calculated using the Kramers-Kronig relationship. This choice of operating wavelength, 510, thus minimizes carrier induced chirp as the SOA is biased, thereby minimizing broadening of the spectral linewidth of the seed laser as it is modulated.

Figure 6:
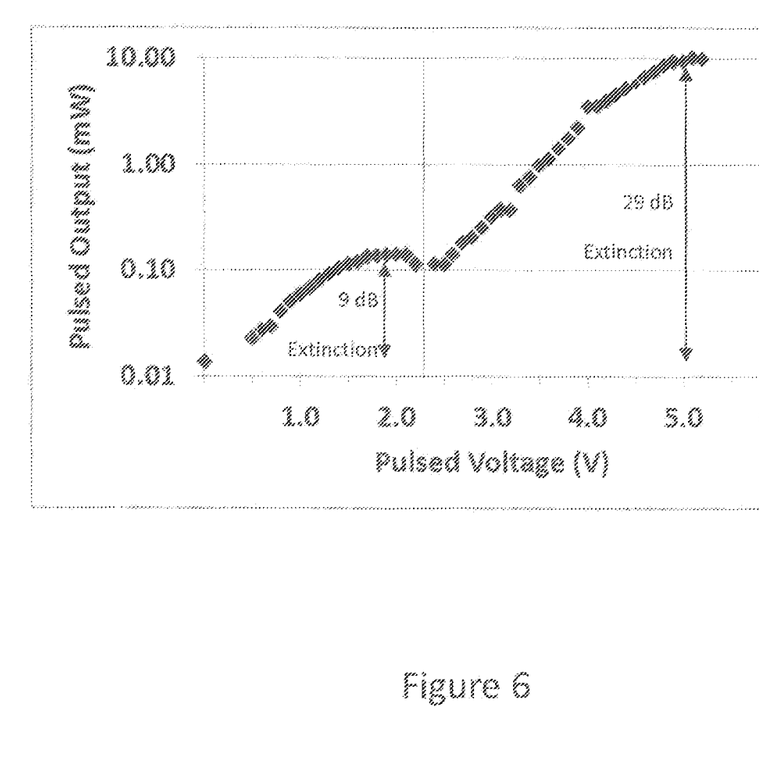
FIG. 6 illustrates experimental results of the output power of a SOA operating as a modulator, as a function of pulsed drive voltage.

FIG. 6, shows experimental results of the output power of a SOA operating as a modulator, as a function of pulsed drive voltage. The device has a negative DC voltage, $V_{bias}$, 410 (of FIG. 4) of approximately −2.6V applied to it through a bias-T to suppress the transmitted power between pulses, increasing the extinction ratio by 9 dB in accordance with the invention. The seed laser wavelength in this case is 808 nm, emitting 0.6 mW of output power.

Figure 7:
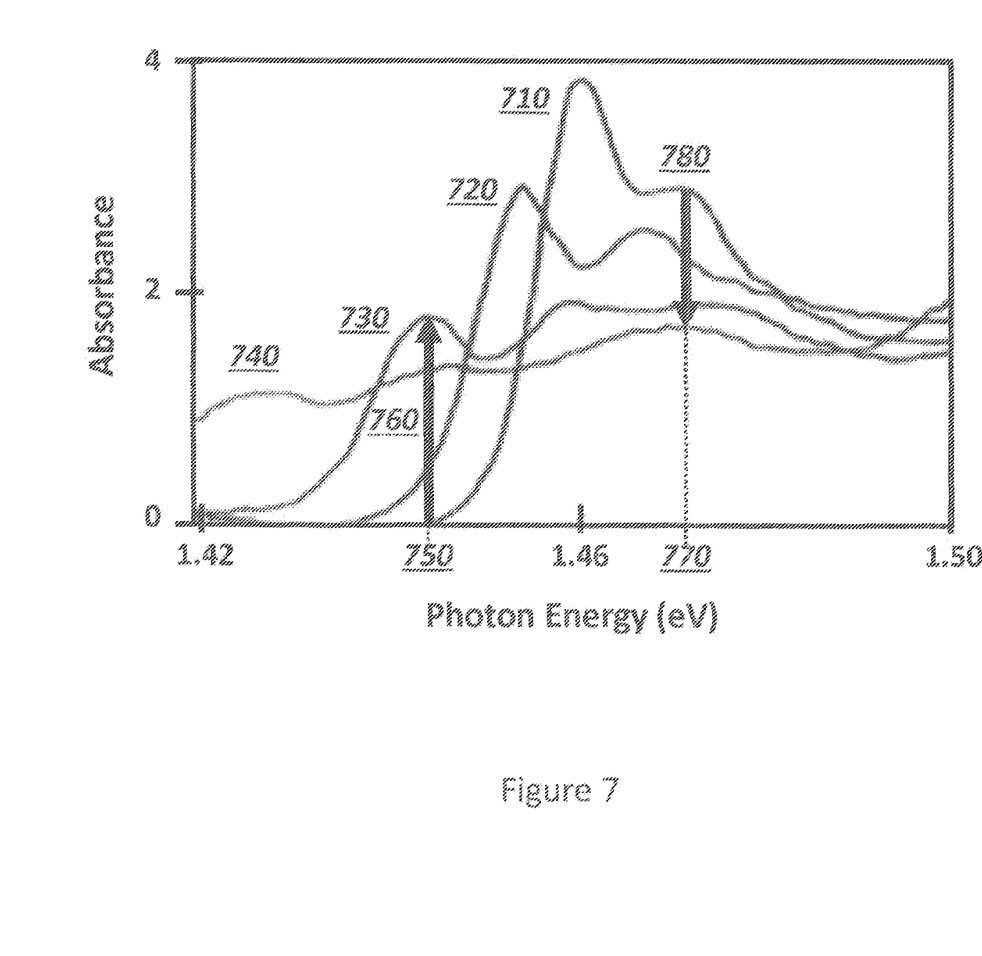
FIG. 7 illustrates an exemplary spectral absorption of an EAM as a function of increasing reverse voltage, for TE and TM polarizations.

The SOA 130 may be operated either by red-shifting or blue-shifting the wavelength from the spontaneous emission peak of the SOA device 230. In the case of red-shifting, the wavelength 115 of the seed laser 110 is chosen to be below the optical bandgap energy of the SOA device 130, (i.e., on the long wavelength side of the spontaneous emission peak). FIG. 7, adapted from S.-L Chuang, S. Schmitt-Rink, D. A. B. Miller and D. S. Chemla, *"Exciton Green's function approach to optical absorption in a quantum well with an applied electric field."* Phys. Rev. B, 43, 2, pp. 1500-1509 (1991), shows typical absorbance spectra for a quantum well device structure, through the device for the case of a TE mode propagation. Different reverse (i.e., negative) bias voltages create a corresponding set of absorbance spectra; 0 V, 710; 5 V, 720; 9.8 V, 230; and 15.5 V, 740.

In an exemplary case, a wavelength, 750, of approximately 860 nm corresponding to an energy of approximately 1.442 eV (electron volts), may be selected to correspond to the absorption peak corresponding to a negative bias voltage of 9.8 volts. The wavelength 750 is chosen to be red-shifted compared to the wavelength of the absorption peak at zero bias voltage, indicated by the spectrum line 710. The SOA device 130 may thus be modulated between a reverse bias voltage of 9.8 volts (line 730) and 0 volts (line 710), creating an increase of absorbance shown by the upward arrow 760.

Alternate methods of operation of the SOA device, 130, may be either blue-shifting the wavelength 115 of the seed laser 110 with respect to the spontaneous emission peak of the SOA device 130 or by tuning the seed laser 110 to coincide with spontaneous emission peak of the SOA device 130. An example of the former method is shown in FIG. 7 by selecting a wavelength, 770. The wavelength, 770, shown in the exemplary case is approximately 843 nm, corresponding to an energy of approximately 1.471 eV. In this case, downward arrow 780 indicates a decrease in absorption that can be used to modulate the optical signal as SOA device 130 is modulated between a reverse bias of 0 volts (line 710) and 9.8 volts (line 740).

This alternative mode is not typically available to EAMs as the insertion loss is too high and the modulation of the optical absorption by the quantum-confined Stark effect too small to achieve usable modulation depth. However, by operating the SOA device 130 under forward bias, the gain of the SOA device is sufficient to overcome the insertion loss and achieve good extinction ratios. In addition, for operating wavelengths above the optical bandgap, the linewidth enhancement factor is minimized and carrier induced optical chirp reduced, leading to enhanced coherence of the modulated light.

Figure 8:
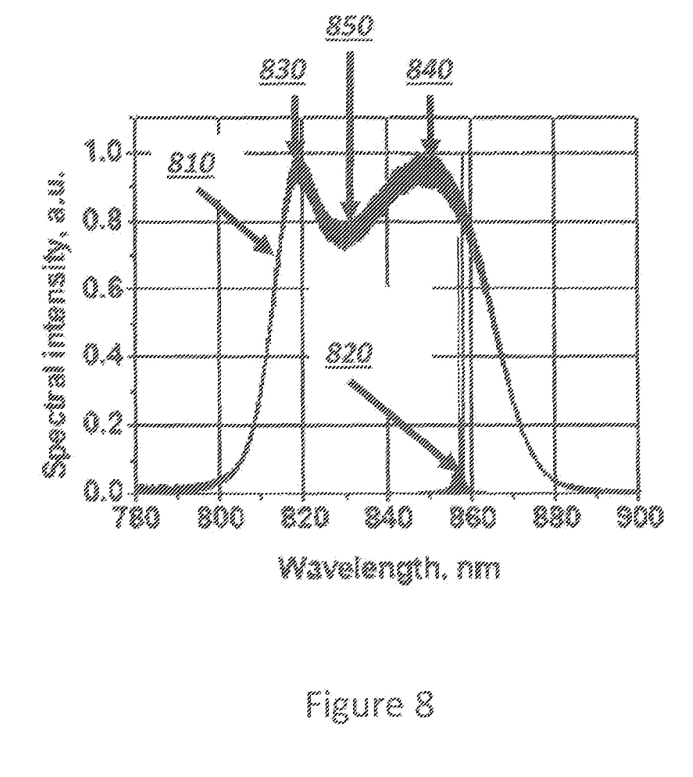
FIG. 8 illustrates an exemplary wide gain spectrum of a quantum well SOA operating as a superluminescent diode.

For some quantum well SOAs, the quantum well structure is designed such that both the n=1 and n=2 states of the quantum well are excited, significantly broadening the emission wavelength from the SOA 130, especially as the drive current is increased. A representative operating spectrum, 810, is shown in FIG. 8. This spectrum was obtained by operating the SOA 130 as a superluminescent light-emitting diode (SLD), which is simply operating the SOA 130 as a light source by itself without the use of a seed laser 110. The SOA 130 may be the type of structure shown in FIGS. 2 and 3, for example. The gain spectrum of SOA operating as an SLD is identical with that of the SOA operating as a gain device. Also shown in FIG. 8 is an exemplary laser spectrum, 820, of the laser formed from the same type of semiconductor chip, but which has a highly reflective coating applied to the rear facet and a 4% reflecting coating applied to the emitting facet instead of the antlreflection coatings applied to the facets of the SOA. The light emission, as shown in FIG. 8, is typical of hybrid external cavity laser sources in which an external cavity is designed such that the light emission is on the red-shifted portion of the gain spectrum of the semiconductor chip.

Under SOA operation the wavelength of the seed laser, 110, may instead be advantageously chosen to be at a point in the amplifier gain spectrum between the wavelengths of the two quantum well transition peaks 830 (corresponding to the n=1 state) and 840 (corresponding to the n=2 state). The spectral dependence of the gain is nearly flat in this region, 850, and the corresponding refractive index change with wavelength is nearly zero. This is significant in that within this spectral region 850, in pulsed operation as the temperature and, hence, the gain spectrum of the SOA device changes during the pulse, there is minimal change in the refractive index seen by the seed laser 110 at its operating wavelength. Thus, dispersion due to thermal effects is minimized and coherence over the duration of the pulse is maximized.

In an alternative embodiment of the invention, a double heterostructure (DH) active layer approximately 100 nm in thickness replaces the quantum well active layer (see FIG. 2) in the SOA device, 130. The use of a DH eliminates the extremely wide double peaked gain spectrum typical of an SOA or SLD, as shown FIG. 8, and replaces it with a more Gaussian gain spectrum, of the order of 10 nm in width, as is well known in the art. In this case the effect of reverse biasing the SOA device, 130, is minimized and the seed laser wavelength 115 is placed advantageously at the band gap of the SOA device 130. This has the effect of reducing transmission through the SOA device 130 in the absence of bias as well as minimizing dispersion as the carrier induced differential refractive index change is nominally zero at the gain peak. In addition, the much thicker (approximately 10 times the quantum well thickness) active layer has a substantially reduced volume carrier density at the same drive current, further minimizing carrier induced chirp.

As the optical confinement factor of the DH structure is significantly larger than for the QW designs, the transmission through the DH devices is advantageously reduced in the absence of bias, relative to the QW devices. Of course, the device gain of the DH structure is reduced at the lower volume carrier densities, but the gain is still sufficient such that the SOA device 130 may be successfully operated as a modulator at drive currents that remain below 120 mA. Even with the lower gain, however, the increased zero bias loss results in desirable on-off ratios in pulsed operation.

By proper choice of operating conditions and seed laser wavelength, the semiconductor optical amplifier (SOA 130), shown in FIG. 1, may be configured to operate as a loss element, a zero insertion loss devices, or a gain element. Thus, in accordance with the principles of the invention, operating a SOA device at a reverse bias or low forward bias where the SOA gain is insufficient to overcome the optical coupling losses, the SOA may act as a variable attenuator or loss element. By increasing the forward bias until the SOA gain exactly balances the optical losses a zero insertion loss element may be achieved. And by operating the SOA device at yet higher forward biases, a variable gain element may be achieved. In all these operating modes either continuous wave or modulated output may be achieved.

Coherence of the SOA modulator can also be limited by amplified spontaneous emission (ASE) coupled from the SOA into the output fiber when the forward current to the SOA 930 is increased.

Figure 9:
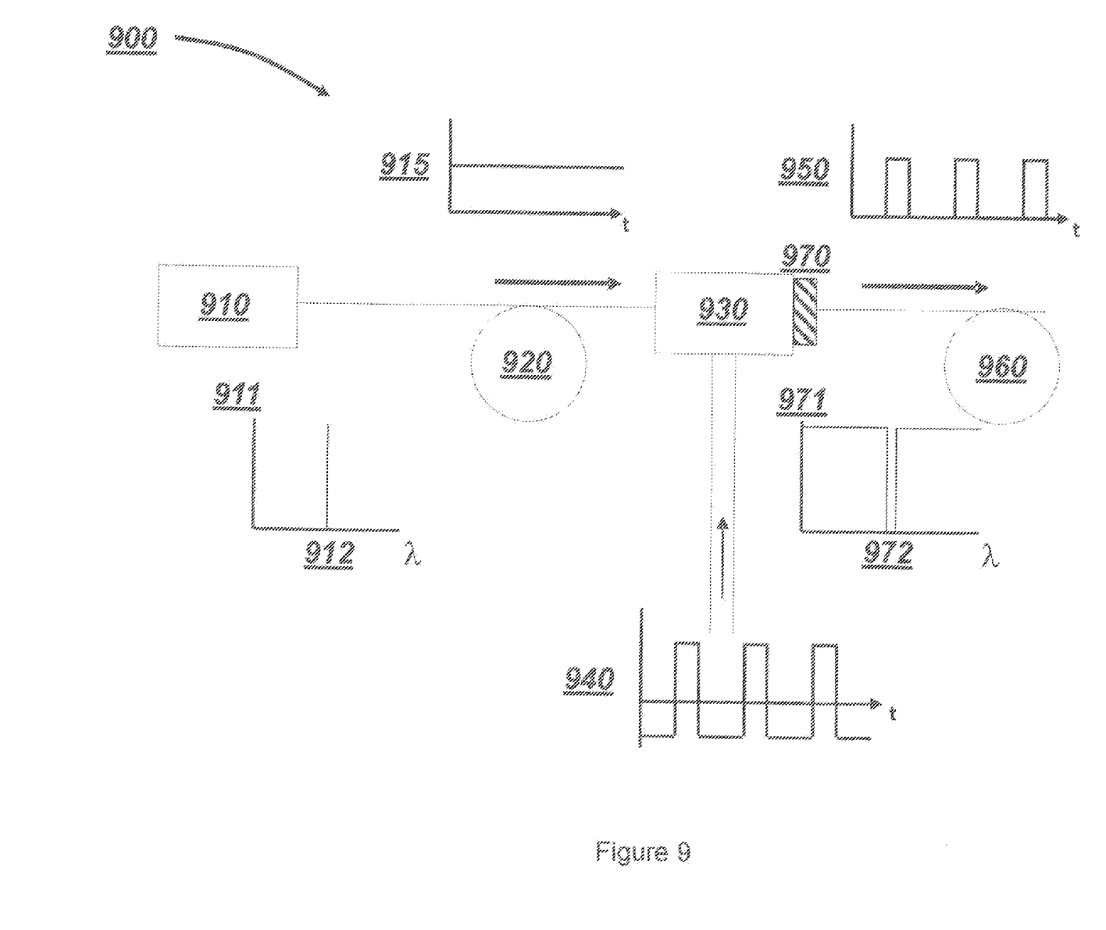
FIG. 9 shows a second embodiment of a system of an SOA operating as a modulator in accordance with the principles of the invention.

FIG. 9 illustrates a second exemplary embodiment 900 of the invention. In this illustrated embodiment, a seed laser, 910, emits light having a spectrum, 911, which is characterized by having a predominantly single wavelength, 912, and which is operating as a CW signal. Element 915 illustrates a time-domain representation of a substantial continuous intensity output of seed laser 910 of a continuous wavelength laser output. The emitted light may be transmitted through a fiber, 920, to an SOA, 930, which is modulated by a pulse train, 940, having a reverse bias voltage, Vbias, and a pulsed peak voltage, Vpeak, as described previously with respect to FIG. 4. In this exemplary embodiment, a narrow passband filter, 970, receives the output of the SOA, 930, modulator. Filter 970 may be separate from, or integrated with, SOA 930. Filter 970 has a transmission spectrum shown as 971, with a narrow passband having a center wavelength, 972, corresponding to substantially the wavelength 915 of seed laser wavelength, 910.

Thus, in accordance with the embodiment shown in FIG. 9, optical bandpass filter 970 is a narrow passband filter having a center wavelength corresponding substantially to the wavelength of the seed laser 910. The filter 970 decreases the amplitude of the ASE that might otherwise be emitted from the SOA 930 and enhances the coherence at higher forward currents. In a particularly advantageous embodiment of the invention, the bandpass filter 970 is placed within the SOA package 930, thereby reducing the size and complexity of the fiber coupling scheme.

The terms "a" or "an" as used herein are to describe elements and components of the invention. This is done merely for convenience and to give a general sense of the invention. The description herein should be read to include one or at least one and the singular also includes the plural unless indicated to the contrary.

The term "comprises", "comprising", "Includes", "including", "as", "having", or any other variation thereof, are intended to cover non-exclusive inclusions. For example, a process, method, article or apparatus that comprises a list of elements is not necessarily limited to only those elements but may include other elements not expressly listed or inherent to such process, method, article, or apparatus. In addition, unless expressly stated to the contrary, the term "or" refers to an inclusive "or" and not to an exclusive "or". For example, a condition A or B is satisfied by any one of the following: A is true for present) and B is false (or not present); A is false (or not present) and B is true (or present); and both A and B are true (or present).

While there has been shown, described, and pointed out fundamental and novel features of the present invention as applied to preferred embodiments thereof, it will be understood that various omissions and substitutions and changes in the form and details of the devices disclosed, and in their operation, may be made by those skilled in the art without departing from the spirit of the present invention.

It is expressly intended that all combinations of those elements that perform substantially the same function in substantially the same way to achieve the same results are within the scope of the invention. Substitutions of elements from one described embodiment to another are also fully intended and contemplated.

Any reference signs in the claims should not be construed as limiting the scope of the claims or the invention described by the subject matter claimed.

What is claimed is:

1. A system for modulating optical radiation, the system comprising:
   a seed laser emitting light at a known wavelength, the emitted light being emitted as a continuous wave;
   a semiconductor optical amplifier providing optical gain at the known wavelength, said semiconductor optical amplifier:
      receiving said continuous wave light emitted at said known wavelength;
      receiving an electrical signal, said electrical signals comprising at least one pulse of a known duration and duty cycle, each of said at least one pulse having a first voltage, selected to bias the semiconductor optical amplifier to an off-mode, and a second voltage being, sufficient to forward bias said semiconductor optical amplifier, wherein said first voltage is related to a power of the seed laser; and
   outputting an optical signal at said known wavelength comprising said at least one pulse of said known duration and duty cycle.

2. The system of claim 1 wherein the known wavelength is between 375 nm and 3 μm.

3. The system of claim 1, wherein the seed laser is a semiconductor diode laser.

4. The system of claim 1, wherein the seed laser is a hybrid external-cavity laser.

5. The system of claim 1, wherein the first voltage is the range of about −1 to about −10 volts.

6. The system of claim 1, wherein the duration of each of the pulses is in a range of about 20 ns to about 200 ns.

7. The system of claim 1, wherein the known wavelength of the seed laser is selected to be substantially at a peak of an optical gain of the semiconductor optical amplifier.

8. The system of claim 1, wherein the known wavelength of the seed laser is displaced from a peak of an optical gain of the semiconductor optical amplifier to a longer wavelength.

9. The system of claim 1, wherein the known wavelength of the seed laser is displaced from a peak of an optical gain of the semiconductor optical amplifier to a shorter wavelength.

10. The system of claim 1, wherein an active region of the seed laser comprises one or more quantum wells.

11. The system of claim 10, wherein the wavelength of the seed laser is selected to be between peaks of an optical gain due to emission from n=1 and n=2 states of the quantum well(s).

12. The system of claim 1, further comprising:
   an optical fiber transmitting light between an output of the seed laser and an input of the semiconductor optical amplifier.

13. The system of claim 1, further comprising:
   an optical fiber coupled to an output of the semiconductor optical amplifier.

14. The system of claim 1, wherein said light is transmitted between the seed laser and the semiconductor optical amplifier via free space.

15. The system of claim 1, wherein the output of the semiconductor optical amplifier is transmitted into free space.

16. The system of claim 1, wherein an active region of the seed laser is a double-heterostructure.

17. The system of claim 1, wherein the known wavelength of the seed laser is placed at a peak of the optical gain of the semiconductor optical amplifier.

18. The system of claim 1 further comprising:
   a narrow passband filter receiving the output of the semiconductor optical amplifier, said narrow passband filter having a bandpass centered substantially at the known wavelength.

19. The system of claim 1, wherein said forward bias is sufficient to achieve one of: balance optical losses and providing a variable gain.

20. A method for modulating a continuous wave optical output of a seed laser emitting light at a known wavelength, said method comprising the steps of:
   providing said continuous wave optical output to a semiconductor optical amplifier that provides optical gain at the known wavelength;
   reverse biasing the semiconductor optical amplifier, said reverse biasing being related to a power of the seed laser;
   modulating the semiconductor optical amplifier by a train of electrical signals comprising pulses of peak forward voltage;
   wherein a peak forward voltage is sufficient to forward bias said semiconductor optical amplifier; and
   outputting a train of optical pulses emitted from the semiconductor optical amplifier.

21. The method of claim 20 wherein the known wavelength is between 375 nm and 3 μm.

22. The method of claim 20 wherein the seed laser is a semiconductor diode laser.

23. The method of claim 20 wherein the seed laser is a hybrid external-cavity laser.

24. The method of claim 20 wherein the reverse DC bias voltage is the range of about −1 to about −10 volts.

25. The method of claim 20 wherein the duration of the pulses comprising said train of electrical signals is between about 20 ns and about 200 ns.

26. The method of claim 20 wherein the known wavelength of the seed laser is placed at a peak of the optical gain of the semiconductor optical amplifier.

27. The method of claim 20 wherein the known wavelength of the seed laser is displaced from a peak of an optical gain of the semiconductor optical amplifier to a longer wavelength.

28. The method of claim 20 wherein the known wavelength of the seed laser is displaced from a peak of an optical gain of the semiconductor optical amplifier to a shorter wavelength.

29. The method of claim 20 wherein the active region of the seed laser comprises one or more quantum wells.

30. The method of claim 20, wherein light transmission between the seed laser and the semiconductor optical amplifier is via an optical fiber.

31. The method of claim 20, wherein the output of the semiconductor optical amplifier is coupled into an optical fiber.

32. The method of claim 20, wherein light is transmitted between the seed laser and the semiconductor optical amplifier via free space.

33. The method of claim 20, wherein the output of the semiconductor amplifier is transmitted into free space.

34. The method of claim 20, wherein the active region of the seed laser is a double-heterostructure.

35. The method of claim 20, wherein the known wavelength of the seed laser is placed at the peak of the optical gain of the semiconductor optical amplifier.

36. The method of claim 20, further comprising:
   filtering the output of the optical semiconductor amplifier.

37. A method of operating a semiconductor optical amplifier, said method comprising:
   providing a continuous input wavelength to a first input of said semiconductor optical amplifier;
   providing a pulse train to said to a second input of said semiconductor optical amplifier, wherein pulses in said pulse train have a first voltage for a known period of time, said first voltage, related to a power of the continuous input wavelength, reverse biasing said semiconductor optical amplifier to a high extinction value; and
   a second voltage for a second known period of time, said second voltage forwarding biasing said semiconductor optical amplifier, wherein said second voltage is selected as a voltage as one of: sufficient to compensate for losses in said semiconductor optical amplifier and sufficient to generate a gain in said semiconductor optical amplifier; and
   outputting said continuous input wavelength modulated by said pulse train.

\* \* \* \* \*